United States Patent [19]

Franzen et al.

[11] 4,220,545

[45] Sep. 2, 1980

[54] IONIZATION CHAMBER FOR CHEMICAL IONIZATION

[75] Inventors: Jochen Franzen, Wildeshausen; Gerhard Weiss, Varrel, both of Fed. Rep. of Germany

[73] Assignee: Dr. Franzen Analysentechnik GmbH & Co. Kommanditgesellschaft, Bremen, Fed. Rep. of Germany

[21] Appl. No.: 935,131

[22] Filed: Aug. 21, 1978

[30] Foreign Application Priority Data

Aug. 23, 1977 [DE] Fed. Rep. of Germany ....... 2737852

[51] Int. Cl.² .............................................. H01J 37/08

[52] U.S. Cl. .................................... 250/530; 250/531; 250/423 R; 250/427; 313/230; 313/362

[58] Field of Search ................... 250/530, 531, 423 R, 250/424, 427; 313/362, 230

[56] References Cited

U.S. PATENT DOCUMENTS

| | | | |
|---|---|---|---|
| 3,555,272 | 1/1971 | Munson et al. | 250/424 |
| 3,665,245 | 5/1972 | Schwartz | 250/427 |
| 3,984,692 | 10/1976 | Arsenault | 250/423 R |
| 4,123,316 | 10/1978 | Tsuchimoto | 250/531 |

*Primary Examiner*—Deborah L. Kyle
*Attorney, Agent, or Firm*—Toren, McGeady and Stanger

[57] ABSTRACT

Ionization chamber for the chemical ionization of vapors of substances in ion-molecule reactions by means of ionizing primary particles and a reactance gas, having at least one inlet opening for feeding the reaction partners and at least one outlet opening for the reaction products formed in the chamber. As shown, the ionization chamber has an elongated shape. The inlet opening for the ionizing primary particles on the one hand, and the outlet opening for the reaction products on the other hand, are arranged in alignment in opposite end walls of the ionization chamber.

9 Claims, 3 Drawing Figures

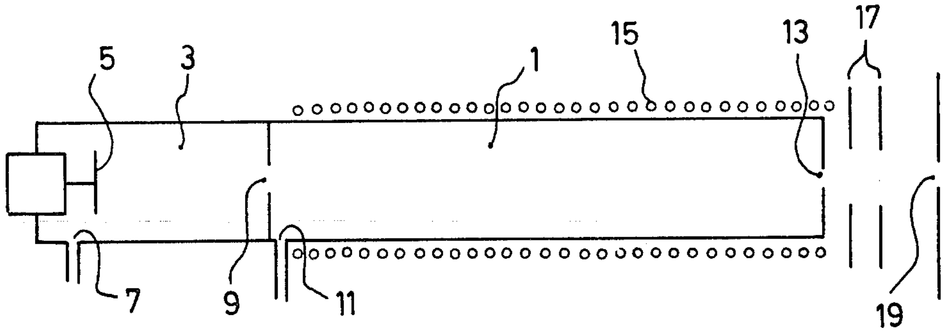
FIG.1
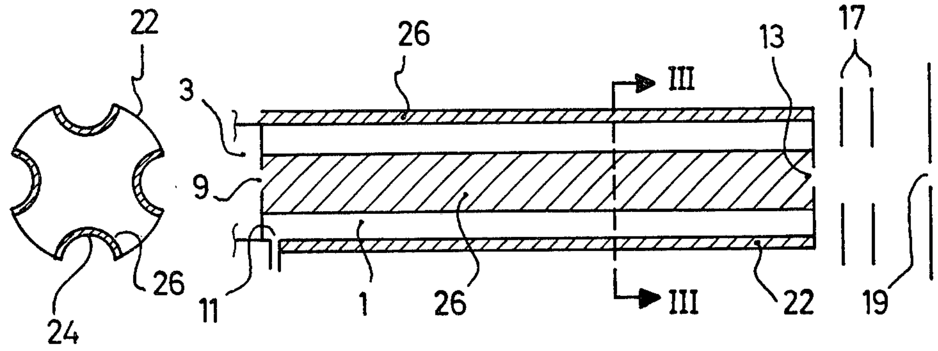
FIG.3
FIG.2

IONIZATION CHAMBER FOR CHEMICAL IONIZATION

FIELD OF THE INVENTION

The invention relates to an ionization chamber for the chemical ionization of vapors of substances in ion-molecule reactions by means of ionizing primary particles and a reactance gas, having at least one inlet opening for feeding the reaction partners and at least one outlet opening for the reaction products formed in the chamber.

BACKGROUND OF THE INVENTION

The ionization of atoms or molecules, particularly of organic substances, in ion-molecule reactions, also called chemical ionization, has, compared to the usual ionization by electronic impact, the advantage of low fragmentation of the examined substances. In principle, it also facilitates a higher sensitivity which is not yet reached in practice in ionization chambers of the usual type.

The chemical ionization usually takes place in an ionization chamber between the ions of a reactance gas and the molecules of the substance to be examined at pressures of 0.1 to 2 mbar, particularly in the range of 0.5 to 1 mbar. The pressure is essentially generated by the reactance gas, while the substance to be examined with its vapors or its gas has only a partial pressure of $10^{-6}$ to $10^{-2}$ mbar. The reactance gas and the gas or the vapor of the substance to be examined are fed into the ionization chamber through special openings either in the mixed state or generally individually. In this case, the reactance gas must have an ionization energy whose level is higher than the ionization energy of the desired product ions of the substance to be examined; the usual reactance gases are isobutane, methane, water vapor or ammonia.

The reactance gas is usually partially ionized in a primary ionization process wherein electrons produced by a hot or thermionic cathode enter the ionization chamber through an inlet opening and through a focusing diaphragm and react with the reactance gas in the ionization chamber. The created reactance gas ions then react—partially in intermediate processes with the participation of additional reactance gas molecules—with the molecules of the substance to be examined, wherein the reactions, due to the extremely high reaction cross-sections, proceed quickly and with a high yield. Since, due to the chosen energy level, recombinations of the created product ions are only possible by means of triple collision, the product ions remain ionized for a long time, i.e., up to a time of several minutes. When the conditions for carrying out the procedure are chosen in a suitable manner, the yield of the ionized molecules of the substance to be examined is 50 to 100%.

The electrons for the primary ionization process of the reactance gas are shot into the ionization chamber with an energy of several hundred electron volts, generally 100 to 500 eV. The simultaneously occurring direct ionization of molecules of the substance to be examined is negligible.

However, the primary ionization can also be achieved by chemical ionization with suitably introduced ions, for example, ions of noble gases, $H_2$, $N_2$ or $O_2$, as described by B. Högger and P. Bommer in Int. J. Mass Spectrom. Ion. Phys. 13, 35 (1974) and by D. F. Hunt, C. N. McEwen and T. M. Harvey in Anal. Chem. 47, 1730 (1975).

Furthermore, the production of ionizing electrons directly in the chamber by an electrical point discharge has also become known according to H. Kambara and I. Kanomata, Int. f. Mass Spectrom. Ion. Phys. 24, 453 (1977).

The created ions of the substance to be examined, together with all other ions and neutral particles, emerge from a small outlet opening into the surrounding vacuum of a mass spectrometer and are fed to the analysis volume through suitable electrostatic accelerating and focusing fields.

The size and the shape of this outlet opening are especially critical since, on the one hand, a small channel-like opening results in too many wall collisions of the ions whereby the ions are discharged and, thus, the ion yield is lowered to a fraction; on the other hand, a large, hole-like outlet opening makes it difficult to maintain the pressure in the ionization chamber and, therefore, requires an excessively high pump power at the mass spectrometer. Therefore, the practically achieved yield of commercially available ion sources for chemical ionization is generally below $10^{-3}$ ions per mole of substance.

Other disadvantages of the ionization chambers with chemical ionization known in the prior art reside in the fact that the discharge velocity competes with the mixing velocity of the reaction partner in the chamber, in the order of magnitude of a millisecond, so that the yield depends from the occurrence of accidental turbulences as a result of the entering flows. The same is true for the mixing of primary ions with the gases of the ionization chamber since the primary ionization takes place only in partial regions of the ionization chamber. In addition, the opening for shooting in the electrons represents a disadvantageous leak since a portion of the chamber contents must necessarily escape through the opening because the generation of electrons requires a high vacuum.

By contrast, the present invention is directed toward improving the known ionization chambers for the chemical ionization of the above-described type while avoiding its disadvantages and, particularly, to create an ionization chamber which leads to a high yield of ions of the substance to be examined at low chamber pressures.

SUMMARY OF THE INVENTION

According to the present invention, in an ionization chamber of the aforementioned type, the ionization chamber has an elongated shape and the inlet opening for the ionizing primary particles on the one hand, and the outlet opening for the reaction products on the other hand, are arranged in alignment in opposite end walls of the ionization chamber.

Thus, according to the present invention, the ionization chamber has an elongated, particularly oblong-cylindrical shape at whose one end the reaction partners enter particularly through various inlet openings and at whose other end the created reaction products are discharged through a joint, central opening. The ionizing primary particles also enter through a central opening at the input end of the elongated ionization chamber so that the ionization reactions take place along the longitudinal axis of the ionization chamber. The essential advantage of this arrangement resides in the fact that, due to the long reaction path, the pressure in the ionization chamber can be drastically reduced while obtaining the same yield so that only a pressure of 0.01 to 0.1 mbar is still required. Therefore, the outlet opening can be enlarged without requiring an excessive pump power so that the portion of the discharged ions of the substance to be examined at the ions in the ionization chamber is increased.

For a better understanding of the present invention, reference is made to the following description and accompanying drawings while the scope of the invention will be pointed out in the appended claims.

BRIEF DESCRIPTION OF THE DRAWINGS

FIG. 1 shows a longitudinal section through an ionization chamber according to the invention with a cylindrical coil arrangement;

FIG. 2 shows a longitudinal section of another embodiment of the ionization chamber according to the invention with quadrupole arrangement; and FIG. 3 shows a section along the line III—III of FIG. 2.

DETAILED DESCRIPTION OF THE INVENTION

Referring to FIG. 1, a gas-discharge chamber 3 is connected to the input side of an actual ionization chamber 1. At that end of the gas-discharge chamber 3, which is located opposite the ionization chamber 1, an electrode 5 is arranged within the gas-discharge chamber 3. The gas-discharge chamber 3 has two openings. An inlet opening 7 is arranged to the side of the electrode 5. The outlet opening of the gas-discharge chamber 3 is arranged opposite the electrode 5 and leads into the ionization chamber 1 as the inlet opening 9.

The inlet opening 9 leading from the gas-discharge chamber 3 into the ionization chamber 1 is located in a narrow end wall of the elongated ionization chamber 1. At the same end, another inlet opening 11 leads laterally into the ionization chamber 1. At the front end of the ionization chamber 1 opposite the inlet opening 9, there is an outlet opening 13 of the ionization chamber 1.

Around the cylindrical ionization chamber 1, there is arranged a cylindrical magnet coil 15 which generates an axial magnetic field in the ionization chamber 1.

Following the outlet opening 13 of the ionization chamber 1 there is, outside of the ionization chamber 1, a focusing and accelerating system 17 in the form of electrical lenses which are provided with pinhole diaphragms.

The system 17 is followed by the inlet opening 19 of the mass spectrometer.

The embodiment of the FIGS. 2 and 3 is arranged similarly to the embodiment of the ionization chamber 1 of FIG. 1; the ionization chamber 1 is merely in a quadrupole tube 22 which is formed by a cylindrical tube with tube indentations 24 onto which indentations there are applied metal electrodes 26, for example, in the form of thin foils.

The primary gas flows through the inlet opening 7 of the gas-discharge chamber 3 into the gas-discharge chamber 3 and is at least partially ionized in the gas-discharge chamber 3 by the electrode 5. The partially ionized primary gas flows through the axial opening 9 from the gas-discharge chamber 3 into the elongated ionization chamber 1. A mixture of reactance gas and substance gas enters through the inlet opening 11. The reactance gas is then ionized in a primary ionization by the primary particles and, in turn, ionizes the substance gas.

The magnet 15 generates an axial magnetic field in the ionization chamber 1 whereby the ionized particles are held together.

The same is achieved by means of the quadrupole tube 22 of FIGS. 2 and 3.

The reaction products are finally discharged from the ionization chamber through the outlet opening 13 and are guided and accelerated toward the inlet opening 19 of the mass spectrometer by means of the focusing and accelerating system 17.

As discussed above, an advantage of the ionization chamber according to the invention resides in the fact that, due to the geometric shape of the ionization chamber and due to the resulting lowering in pressure, the mixing of the reaction partners and the primary ions is facilitated.

Further, it has been pointed out that, along the ionization chamber, a longitudinal magnetic field is present. This magnetic field can be generated by a permanent magnet and, furthermore, it can be provided that the permanent magnet consists of a plurality of individual ring magnets which surround the elongated ionization chamber. Alternatively, a magnet coil can be arranged around the ionization chamber. As a result, the charged particles, namely the ionized primary particles as well as the ions of the reactance gas and the substance, are held near the axis by the generated magnetic field and are, thus, restrained from wall collisions and are guided toward the outlet opening.

In the interior of the ionization chamber, an electric multipole of at least four radially symmetrically arranged oblong pole rods can be provided in an insulated manner to which pole rods symmetrical or asymmetrical high-frequency alternating voltages are applied in succession and in pairs. The wall of the ionization chamber can also be constructed as a multipole tube with electrodes to which symmetrical or asymmetrical high-frequency alternating voltages are applied in succession and in pairs. The pole rods or the pole surfaces of the metal electrodes may also extend parallel to the axis of symmetry of the ionization chamber; the pole rods or the pole surfaces of the metal electrodes can be arranged conically to the axis of symmetry of the ionization chamber. The particles are thereby held near the axis in a corresponding manner.

Further, a potential gradient in the longitudinal axis of the ionization chamber can be provided. The generated electrostatic potential gradient allows the desired ions to drift in the direction of the outlet opening. This generation of a potential gradient by means of a charged pusher diaphragm or by applying a voltage at end surfaces of the chamber arranged in an insulated manner is another important feature of the invention.

As described above, a diaphragm arrangement assigned to the outlet opening can be provided, the diaphragm arrangement generating an electrostatic lens field which interacts with the ionization chamber symmetrically to the longitudinal axis of the ionization chamber. The diaphragm arrangement effects a focusing extraction of the ions from the ionization chamber, whereby it is especially advantageous that the ions of the substance are thereby grasped or covered at a location of the ionization chamber where the longitudinal magnetic field does not yet have any interfering boundary effects. The general use of this focusing extraction in ion sources of any chosen type is considered an independent feature of the invention.

In one aspect of the invention, a gas-discharged chamber is connected to the input side of the chamber, the ionizing primary particles being generated in the gas-discharge chamber. By using ionized primary particles from an electrical discharge which takes place in a gas which is under a higher pressure than the pressure in the ionization chamber, the discharging of the contents of the chamber through the inlet opening is essentially avoided for the primary particles.

Thus, the ionization chamber according to the invention particularly differs from the known ionization chambers in that, in the latter, the ionizing primary particles are shot in perpendicularly relative to the discharge direction, while according to the invention, the ionizing primary particles are shot in in alignment with the discharge opening. The known ionization chambers, due to their shortness, require a pressure of at least 0.1 mbar in order to achieve a high ion yield.

While the foregoing description and drawings represent the preferred embodiments of the present invention, it will be obvious to those skilled in the art that various changes and modifications may be made therein without departing from the true spirit and scope of the present invention.

What is claimed is:

1. An ionization chamber for the chemical ionization of vapors of a substance in ion-molecule reactions by means of ionizing primary particles and a reactance gas comprising:

an elongated chamber having at least one inlet opening for feeding the substance vapor, the reactance gas and the ionizing primary particles and at least one outlet opening for the reaction products formed in the chamber, said inlet opening for the ionizing primary particles and said outlet opening for the reaction products being arranged in alignment in opposite end walls of said chamber.

2. An ionization chamber according to claim 1, wherein said chamber is an oblong-cylindrical shape and wherein said inlet opening for the primary particles and said outlet opening for the reaction products are arranged on the longitudinal axis of said chamber.

3. An ionization chamber according to claims 1 or 2, wherein at least one separate inlet opening 11 for the reactance gas and/or the substance vapor is provided and wherein said inlet opening is arranged spatially adjacent to said inlet opening for the ionizing primary particles.

4. An ionization chamber according to claim 1, wherein a longitudinal magnetic field is provided along said chamber.

5. An ionization chamber according to claim 4, wherein in the interior of said ionization chamber, there is an electric multipole of at least four radially symmetrically arranged oblong pole rods arranged in an insulating manner to which pole rods symmetrical or asymmetrical high-frequency alternating voltages are applied in succession and in pairs.

6. An ionization chamber according to claim 5, wherein said pole rods or pole surfaces of said electrodes extend parallel to the axis of symmetry of said chamber.

7. An ionization chamber according to claim 5, wherein said pole rods or said pole surfaces of said electrodes are arranged conically to the axis of symmetry of said chamber.

8. An ionization chamber according to claim 4, wherein the longitudinal wall of said chamber is constructed as a multipole tube and wherein conductive electrodes are arranged at the wall to which electrodes symmetrical or asymmetrical high-frequency alternating voltages are applied in succession and in pairs.

9. An ionization chamber according to claim 1, wherein a diaphragm arrangement is provided with respect to said outlet opening, said diaphragm arrangement generating an electrostatic lens field which interacts with said chamber symmetrically to the longitudinal axis of said chamber.

* * * * *